United States Patent
Klang et al.

(10) Patent No.: US 7,545,146 B2
(45) Date of Patent: Jun. 9, 2009

(54) APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL

(75) Inventors: James K. Klang, Wheaton, IL (US); Krzysztof Jeziorczak, Oak Lawn, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 11/008,456

(22) Filed: Dec. 9, 2004

(65) Prior Publication Data

US 2006/0125482 A1 Jun. 15, 2006

(51) Int. Cl.
*G01N 27/416* (2006.01)
(52) U.S. Cl. ..................... 324/426; 320/132
(58) Field of Classification Search .............. 320/139, 320/119, 137, 138, 160, 132, 134, 162; 324/426, 324/427
See application file for complete search history.

(56) References Cited

U.S. PATENT DOCUMENTS

| | | | |
|---|---|---|---|
| 2,000,665 A | 5/1935 | Neal | 439/440 |
| 2,514,745 A | 7/1950 | Dalzell | 324/115 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636.11 |

(Continued)

FOREIGN PATENT DOCUMENTS

EP    0 022 450 A1    1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Akm E Ullah
*Assistant Examiner*—Samuel Berhanu
(74) *Attorney, Agent, or Firm*—Westman, Champlin & Kelly, P.A.

(57) ABSTRACT

A method and apparatus for testing a storage battery is provided in which a battery is measured to obtain a battery dynamic parameter value such as conductance. The battery is measured to obtain an open circuit voltage, a resistance and a recovery voltage differential. A condition of the battery is determined as a function of the measured battery dynamic parameter, the open circuit voltage and the recovery voltage differential.

20 Claims, 11 Drawing Sheets

U.S. PATENT DOCUMENTS

| | | | |
|---|---|---|---|
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,070,624 A | 1/1978 | Taylor | 324/772 |
| 4,080,560 A * | 3/1978 | Abert | 324/429 |
| 4,086,531 A | 4/1978 | Bernier | 324/772 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,315,204 A | 2/1982 | Sievers et al. | 322/28 |
| 4,316,185 A | 2/1982 | Watrous et al. | 320/116.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Kuznicki | 340/636.15 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,126,675 A | 6/1992 | Yang | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,426,371 A | 6/1995 | Salley et al. | 324/429 |

| Patent | Date | Inventor | Class |
|---|---|---|---|
| 5,426,416 A | 6/1995 | Jefferies et al. | 340/664 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,675,234 A | 10/1997 | Greene | 340/636.11 |
| 5,677,077 A | 10/1997 | Faulk | 429/90 |
| 5,699,050 A | 12/1997 | Kanazawa | 340/636.15 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 713/300 |
| 5,739,667 A | 4/1998 | Matsuda et al. | 320/128 |
| 5,745,044 A | 4/1998 | Hyatt, Jr. et al. | 340/5.23 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/160 |
| 5,872,453 A | 2/1999 | Shimoyama et al. | 324/431 |
| 5,895,440 A | 4/1999 | Proctor et al. | 702/63 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A * | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,751 A | 3/2000 | Klang | 320/160 |
| 6,037,777 A | 3/2000 | Champlin | 324/430 |
| 6,037,778 A * | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,091,238 A | 7/2000 | McDermott | 324/207.2 |
| 6,091,245 A * | 7/2000 | Bertness | 324/426 |
| 6,094,033 A | 7/2000 | Ding et al. | 320/132 |
| 6,094,053 A * | 7/2000 | Harvey | 324/434 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,211,651 B1 | 4/2001 | Nemoto | 320/133 |
| 6,215,275 B1 | 4/2001 | Bean | 320/106 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 * | 5/2001 | Varghese et al. | 324/426 |
| 6,236,332 B1 | 5/2001 | Conkright et al. | 340/3.1 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |

| | | | |
|---|---|---|---|
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,274,950 B1 * | 8/2001 | Gottlieb et al. | 307/66 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 * | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 * | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/430 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,045 B1 * | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B2 | 12/2002 | Champlin | 320/132 |
| 6,526,361 B1 | 2/2003 | Jones et al. | 702/63 |
| 6,531,848 B1 | 3/2003 | Chitsazan et al. | 320/153 |
| 6,534,993 B2 | 3/2003 | Bertness | 324/433 |
| 6,544,078 B2 | 4/2003 | Palmisano et al. | 439/762 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,600,815 B1 | 7/2003 | Walding | 379/93.07 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,667,624 B1 | 12/2003 | Raichle et al. | 324/522 |
| 6,679,212 B2 | 1/2004 | Kelling | 123/179.28 |
| 6,696,819 B2 | 2/2004 | Bertness | 320/134 |
| 6,707,303 B2 | 3/2004 | Bertness et al. | 324/426 |
| 6,737,831 B2 | 5/2004 | Champlin | 320/132 |
| 6,759,849 B2 | 7/2004 | Bertness | 324/426 |
| 6,777,945 B2 | 8/2004 | Roberts et al. | 324/426 |
| 6,781,382 B2 | 8/2004 | Johnson | 324/426 |
| 6,784,637 B2 | 8/2004 | Raichle et al. | 320/107 |
| 6,788,025 B2 | 9/2004 | Bertness et al. | 320/104 |
| 6,788,069 B2 * | 9/2004 | Vacher | 324/430 |
| 6,795,782 B2 | 9/2004 | Bertness et al. | 702/63 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 2002/0010558 A1 | 1/2002 | Bertness et al. | 702/63 |
| 2002/0171428 A1 | 11/2002 | Bertness | 702/63 |
| 2002/0176010 A1 | 11/2002 | Wallach et al. | 348/362 |
| 2003/0025481 A1 | 2/2003 | Bertness | 324/427 |
| 2003/0036909 A1 | 2/2003 | Kato | 704/275 |
| 2003/0184262 A1 | 10/2003 | Makhija | 320/156 |
| 2003/0184306 A1 | 10/2003 | Bertness et al. | 324/426 |
| 2003/0194672 A1 | 10/2003 | Roberts et al. | 431/196 |
| 2004/0000590 A1 | 1/2004 | Raichle et al. | 235/462.01 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/182 |

FOREIGN PATENT DOCUMENTS

| | | |
|---|---|---|
| EP | 0 637 754 A1 | 2/1995 |
| EP | 0 772 056 A1 | 5/1997 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4th -Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Improved Impedance Spectroscopy Technique For Status Determination of Production Li/SO$_2$ Batteries" Terrill Atwater et al., pp. 10-113, (1992).

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Supplementary European Search Report Communication for Appl. No. 99917402.2.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23rd International Teleco Conference (Intelec)*, published Oct. 2001, IEE, pp. 433-440.

"Examination Report" from the U.K. Patent Office for U.K. App. No. 0417678.0.

"Notification of Transmittal of The International Search Report or the Declaration", PCT/US03/41561.

* cited by examiner

CALCULATIONS

APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL

BACKGROUND OF THE INVENTION

The present invention relates to testing of storage batteries, and in particular storage batteries typically used in electric vehicles such as golf cars. More specifically, the present invention relates to electronic battery testers that measure a dynamic parameter of a battery and determine its capacity and fitness for further service.

Electronic battery testers are used to test storage batteries. Various examples of such testers are described in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUN-AWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/960,117, filed Sep. 20, 2001, entitled IN-VEHICLE BATTERY MONITOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/379,281, filed May 8, 2002, entitled METHOD FOR DETERMINING BATTERY STATE OF CHARGE; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser. No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELATIVE TEST OUTPUT; U.S. Ser. No. 60/415,796, filed Oct. 3, 2002, entitled QUERY BASED ELECTRONIC BATTERY TESTER; U.S. Ser. No. 10/271,342, filed Oct. 15, 2002, entitled IN-VEHICLE BATTERY MONITOR; U.S. Ser. No. 10/270,777, filed Oct. 15, 2002, entitled PROGRAMMABLE CURRENT EXCITER FOR MEASURING AC IMMITTANCE OF CELLS AND BATTERIES; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE, U.S. Ser. No. 60/437,255, filed Dec. 31, 2002, entitled REMAINING TIME PREDICTIONS, U.S. Ser. No. 60/437,224, filed Dec. 31, 2002, entitled DISCHARGE VOLTAGE PREDICTIONS, U.S. Ser. No. 10/349,053, filed Jan. 22, 2003, entitled APPARATUS AND METHOD FOR PROTECTING A BATTERY FROM OVERDISCHARGE, U.S. Ser. No. 10/388,855, filed Mar. 14, 2003, entitled ELECTRONIC BATTERY TESTER WITH BATTERY FAILURE TEMPERATURE DETERMINATION, U.S. Ser. No. 10/396,550, filed Mar. 25, 2003, entitled ELECTRONIC BATTERY TESTER, U.S. Ser. No. 60/467,872, filed May 5, 2003, entitled METHOD FOR DETERMINING BATTERY STATE OF CHARGE, U.S. Ser. No. 60/477,082, filed Jun. 9, 2003, entitled ALTERNATOR TESTER, U.S. Ser. No. 10/460,749, filed Jun. 12, 2003, entitled MODULAR BATTERY TESTER FOR SCAN TOOL, U.S. Ser. No. 10/462,323, filed Jun. 16, 2003, entitled ELECTRONIC BATTERY TESTER HAVING A USER INTERFACE TO CONFIGURE A PRINTER, U.S. Ser. No. 10/601,608, filed Jun. 23, 2003, entitled CABLE FOR ELECTRONIC BATTERY TESTER, U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE, which are incorporated herein in their entirety.

In general, prior art battery testers, that test storage batteries by measuring battery conductance, are capable of relatively accurately determining whether the batteries fall in a "good" or "bad" category with respect to short, high rate discharges. However, in certain applications, such as golf cars that are powered over an extended period of time by battery strings, determining battery and string conditions solely on the basis of battery conductance measurements may provide inadequate results.

SUMMARY OF THE INVENTION

The present invention is directed to the use of a dynamic battery parameter, coupled with battery recovery voltage differential (change in voltage after the battery is initially released from a load until some time later (for example, 10 seconds)), to determine battery capacity and fitness for further service. A method and apparatus for testing a storage battery is provided in which a battery is measured to obtain a battery dynamic parameter value such as conductance. The battery is measured to obtain an open circuit voltage and a recovery voltage differential after a brief applied load. A condition of the battery is determined as a function of the measured battery dynamic parameter, the open circuit voltage and the recovery voltage differential.

BRIEF DESCRIPTION OF THE DRAWINGS

FIGS. 4-1 to 4-8 are flowcharts showing the steps of a method of testing a battery in accordance with a specific embodiment of the present invention.

DETAILED DESCRIPTION OF THE PREFERRED EMBODIMENTS

Figure 1:
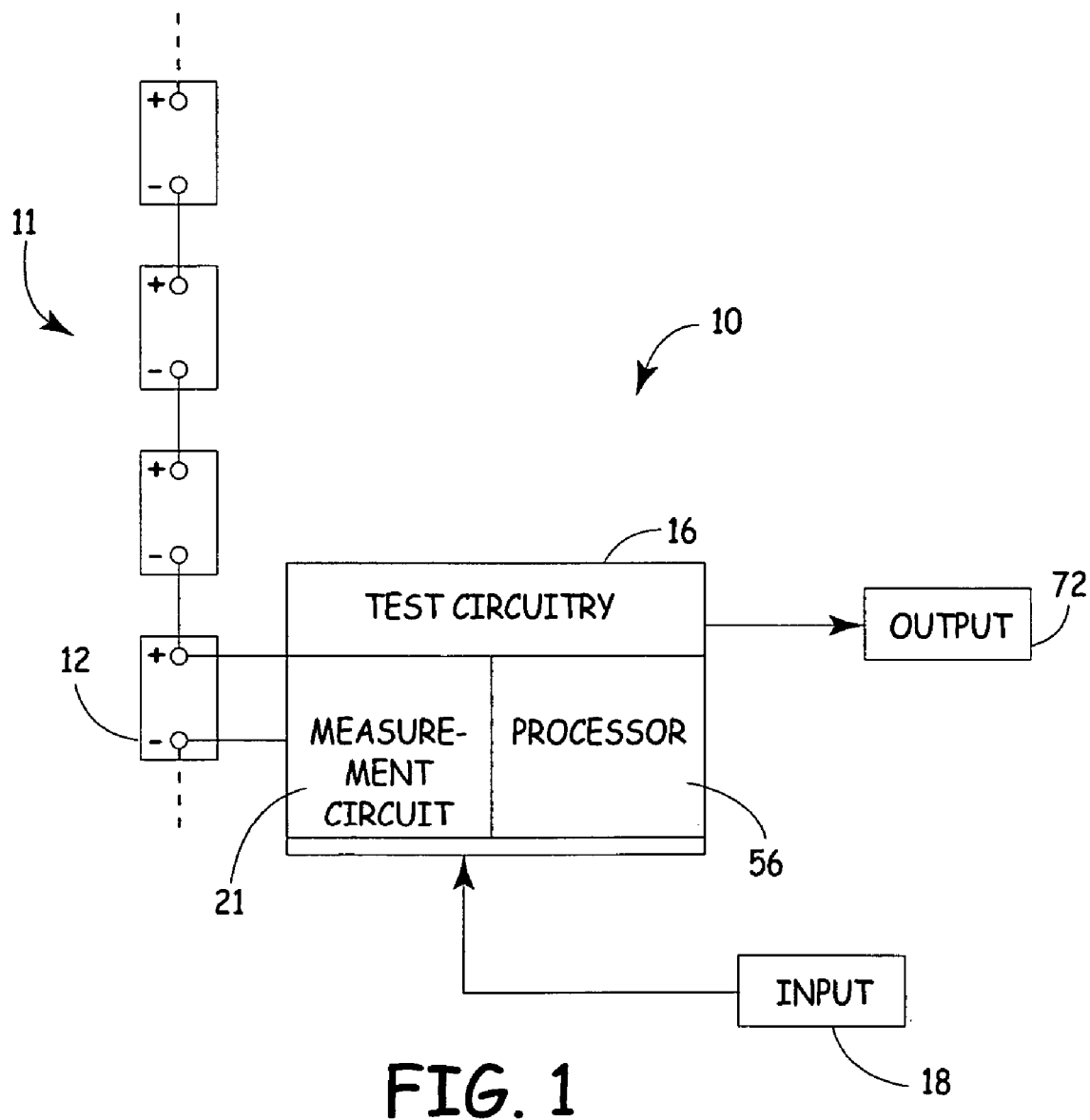
FIG. 1 is a simplified schematic diagram of a battery tester in accordance with the present invention.

FIG. 1 is a very simplified block diagram of a battery tester 10 in accordance with an illustrative embodiment of the present invention. The same reference numerals are used in the various figures to represent the same or similar elements. Battery tester 10 includes test circuitry 16 that electrically couples to a battery 12 of a battery string 11. Test circuitry 16 includes measurement circuit 21 and processor 56. Measurement circuit 21, which operates under the control of processor 56, can be any circuit configuration which is capable of carrying out different battery voltage measurements, current measurements, etc., required to determine battery capacity in accordance with the present invention.

In accordance with the present invention, battery tester 10 combines prediction of battery capacity from a battery dynamic parameter, such as battery conductance, along with an additional judgment based on a recovery voltage differential. As used herein, the recovery voltage differential is the change in voltage after the battery is initially released from a load until some time later (for example, 10 seconds). Again, there is no load from the beginning to the end of the recovery period. Although the example embodiments of the present invention described herein relate to battery capacity predictions from battery conductance measurements and recovery voltage differential, dynamic parameters other than battery conductance may be utilized without departing from the spirit and scope of the invention. Examples of other dynamic parameters include dynamic resistance, admittance, impedance, reactance, susceptance or their combinations.

Using the above predictions as well as determining conditions that would be cause for failure, such as shorting, tester 10 makes a determination of the capacity of battery 12 from unique characteristics (such as maximum battery capacity, the battery resistance limit, minimum open circuit voltage of the battery, etc.) corresponding to the particular type of battery (for example, TROJAN T-105 6V golf car battery). These values can be compared to a passing level of standard capacity testing (the time in minutes that a fully charged battery can run at 75 amps to 1.75V per cell) that the user specifies (inputs via input 18) as needed for battery 12. A condition of battery 12, determined based on the comparison of the predicted capacity value(s) and the passing level of capacity, is provided to the user via output 72.

In addition to being able to carry out the above-described functions, in some embodiments, tester 10 also includes a string function. In other words, tester 10 is capable of testing each battery of multiple batteries in battery string 11 one at a time. After the last battery is tested, the entire string is analyzed to determine if individual batteries are out of balance in voltage or capacity with respect to the rest of the string. If so, there may be operational problems that could develop even though all the batteries in the string meet the specification (have capacities above the minimum passing level of capacity). Out of balance batteries are thus noted by test circuitry 16 and a suitable output is provided to the user via output 72. Of course, a "bad" battery (battery having a capacity below the minimum passing level of capacity) will always be out of balance and out of specification.

Figure 2:
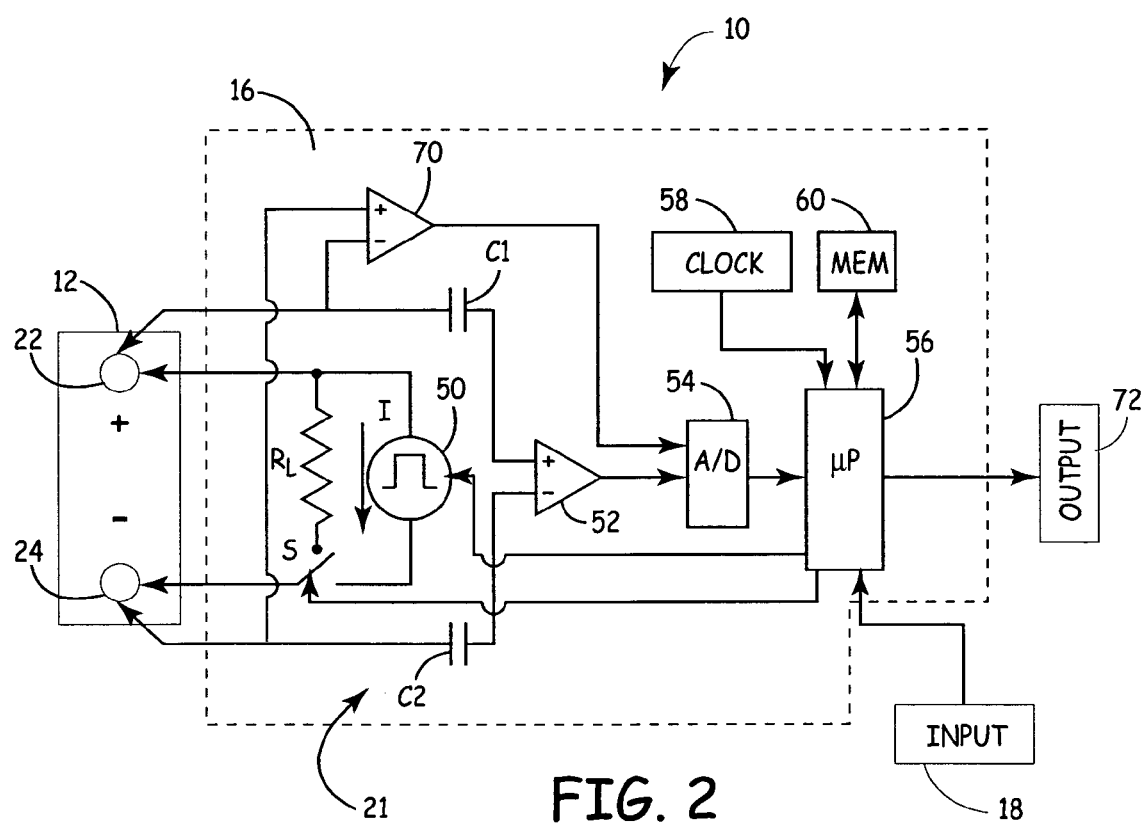
FIG. 2 is a simplified schematic diagram showing battery test circuitry in accordance with the present invention.

FIG. 2 is a more detailed block diagram of battery test circuitry 16, capable of providing the above-mentioned test results, in accordance with an embodiment of the present invention. As in the case of FIG. 1 above, apparatus 16 is shown coupled to an electric vehicle battery 12, which includes a positive battery terminal 22 and a negative battery terminal 24.

Circuitry 16 operates in accordance with one embodiment of the present invention and determines the conductance (G) of battery 12, the open circuit voltage (OCV) between terminals 22 and 24 of battery 12, a load voltage, a load resistance and the recovery voltage differential. Circuitry 16 includes current source 50, differential amplifier 52, analog-to-digital converter 54, microprocessor 56 and a load circuit with associated switch S, which is controlled by microprocessor 56 such that load $R_L$ can be applied to battery 12 for a predetermined time period. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60 and analog-to-digital converter 54. Microprocessor 56 is also capable of receiving inputs or information from input device 18. Microprocessor 56 also connects to output device 72.

In operation, current source 50, which is electrically coupled to battery 12 by switch S, is controlled by microprocessor 56 and provides a current I in the direction shown by the arrow in FIG. 2. In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the OCV of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I generated by current source 50 is known and is stored in memory 60. Microprocessor 56 calculates the conductance (G) (or reciprocally the resistance (R)) of battery 12 using the following equation:

$$\text{Conductance} = G = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$. Microprocessor 56 also uses other information input from input device 18 provided by the tester user. This information includes the particular type of battery, the passing level of battery capacity, etc.

Under the control of microprocessor 56, test circuitry 16 determines a condition of battery 12 as a function of the measured battery dynamic parameter (determined from Equation 1 above), the OCV (measured between the terminals of the battery as described above), the recovery voltage differential and the passing level of battery capacity entered by the user.

It should be noted that the recovery voltage differential is determined by test circuitry 16, with the help of microprocessor 56, by first applying load $R_L$ on the battery for a period of time (10 seconds, for example). The battery voltage and current is measured at the end of the time period. Load $R_L$ is turned off by microprocessor 56, which controls operation of switch S. A first unloaded voltage is measured after a short delay. A second unloaded voltage is then measured after an additional wait period. The difference between the first unloaded voltage and the second unloaded voltage is the recovery voltage differential. All the above measurements are carried out under the control of microprocessor 56. Also, microprocessor 56 carries out all the above computations.

Figure 3:
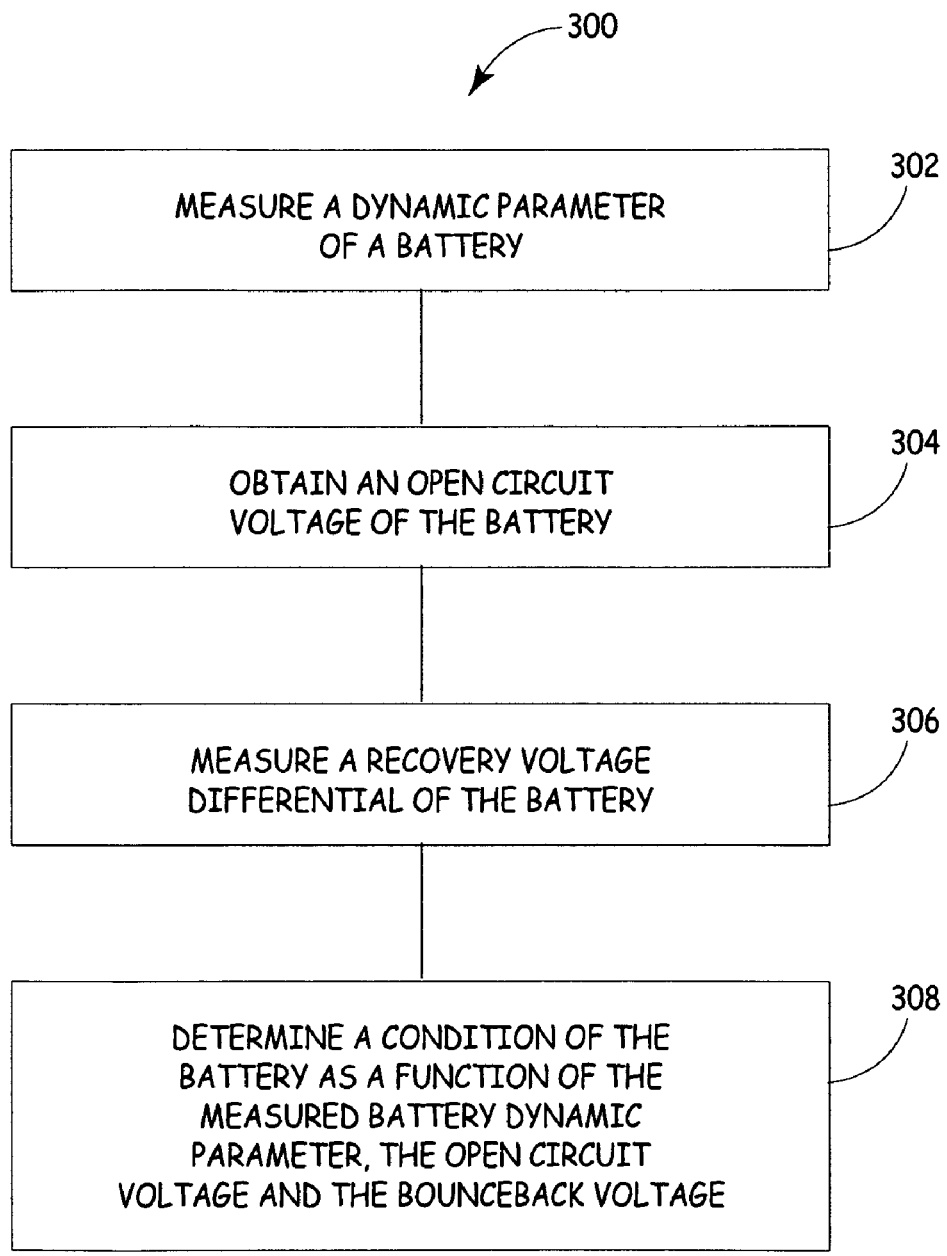
FIG. 3 is a flowchart showing steps of a method of testing a storage battery in accordance with an embodiment of the present invention.

FIG. 3 is a flowchart 300 showing steps of a method of testing a storage battery in accordance with an embodiment of the present invention. At step 302, a dynamic parameter of the battery is measured. At step 304, an open circuit voltage of the battery is obtained. A load current is applied for a given time period after which a load current and voltage is measured. After it is released, a voltage is measured to determine the battery resistance. At step 306, a recovery voltage differential of the battery is measured. At step 308, a condition of the battery is determined as a function of the measured battery dynamic parameter, the open circuit voltage and the recovery voltage differential.

Figures 1, 4:
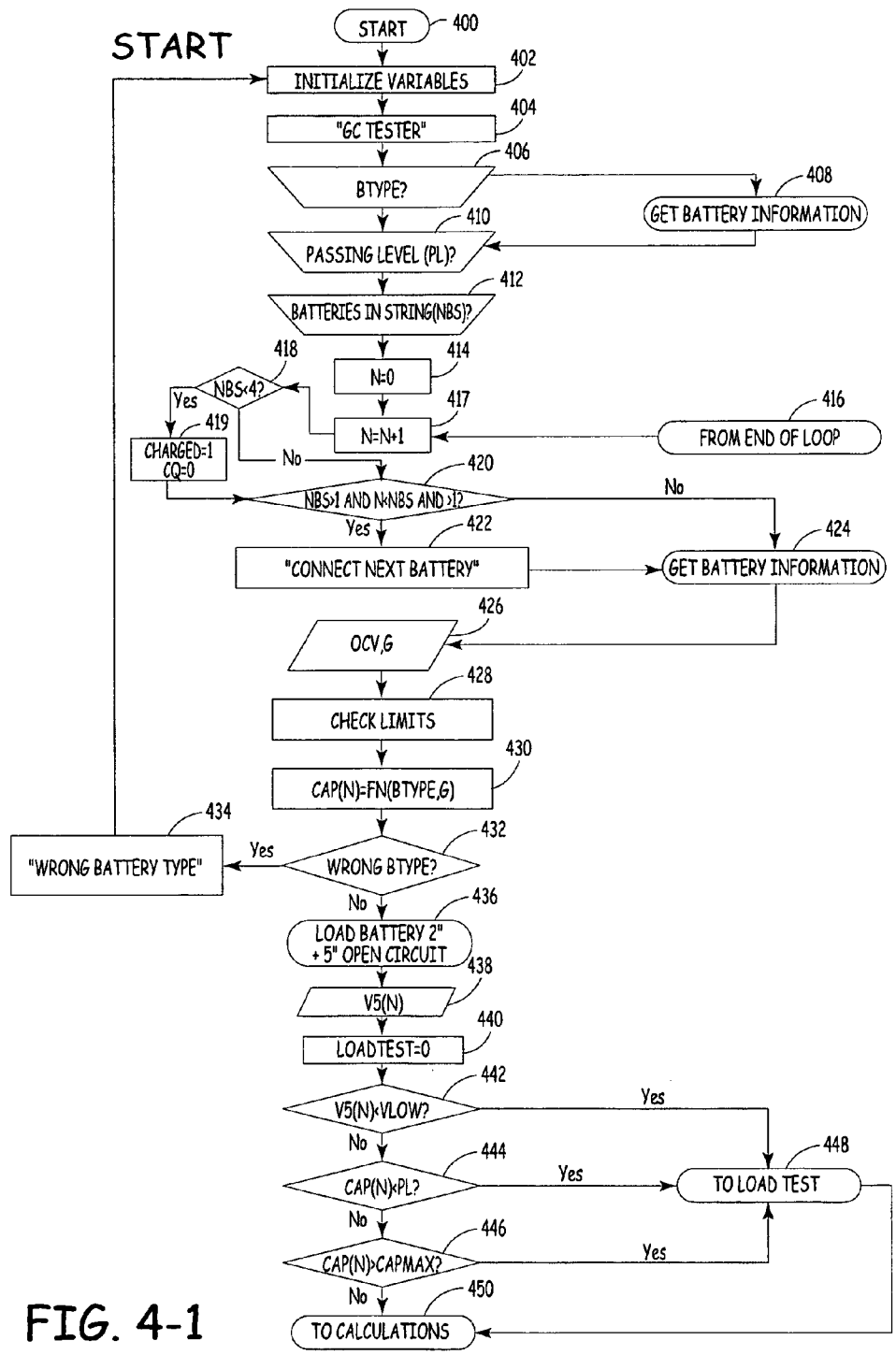
Figures 2, 4:
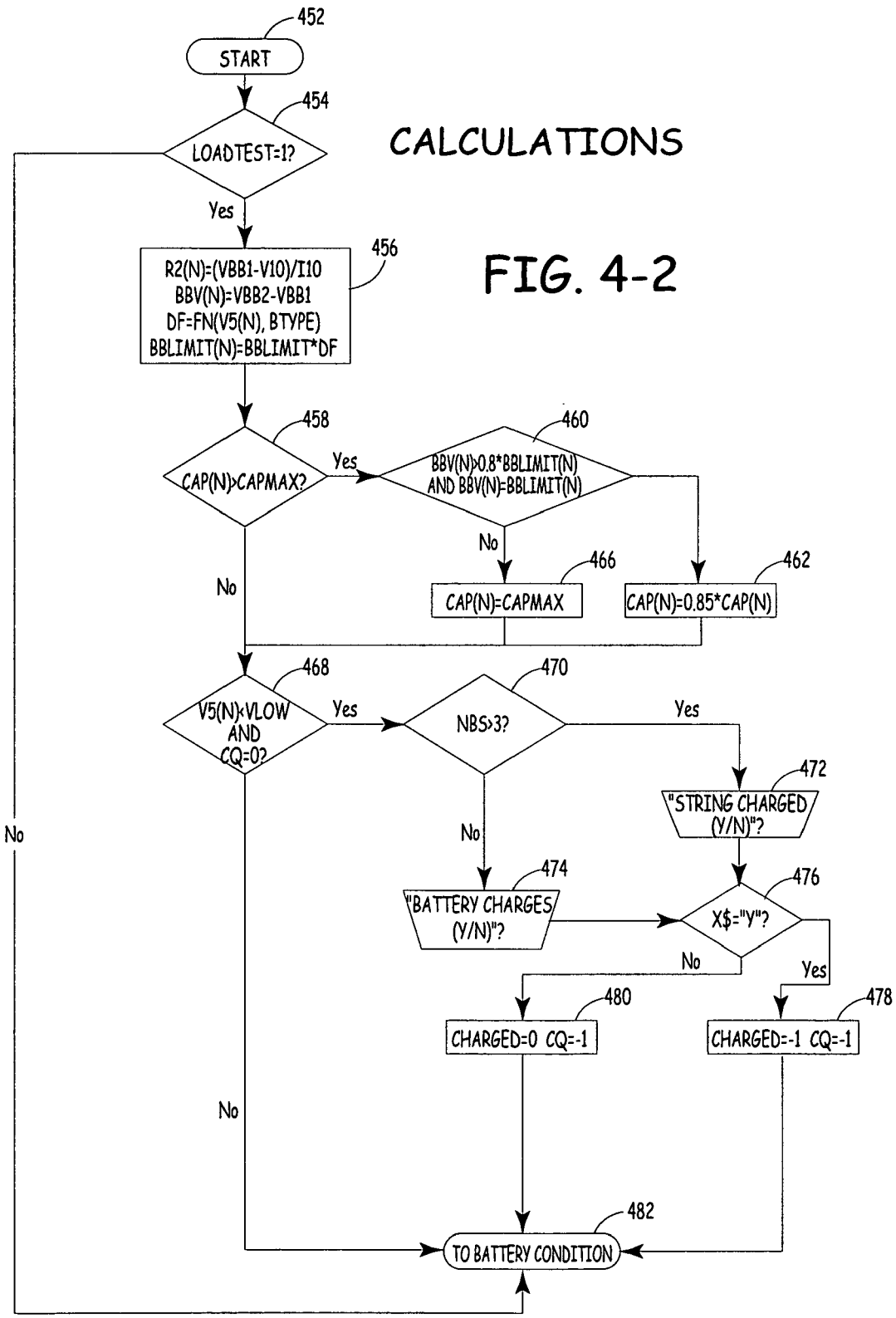
Figures 3, 4:
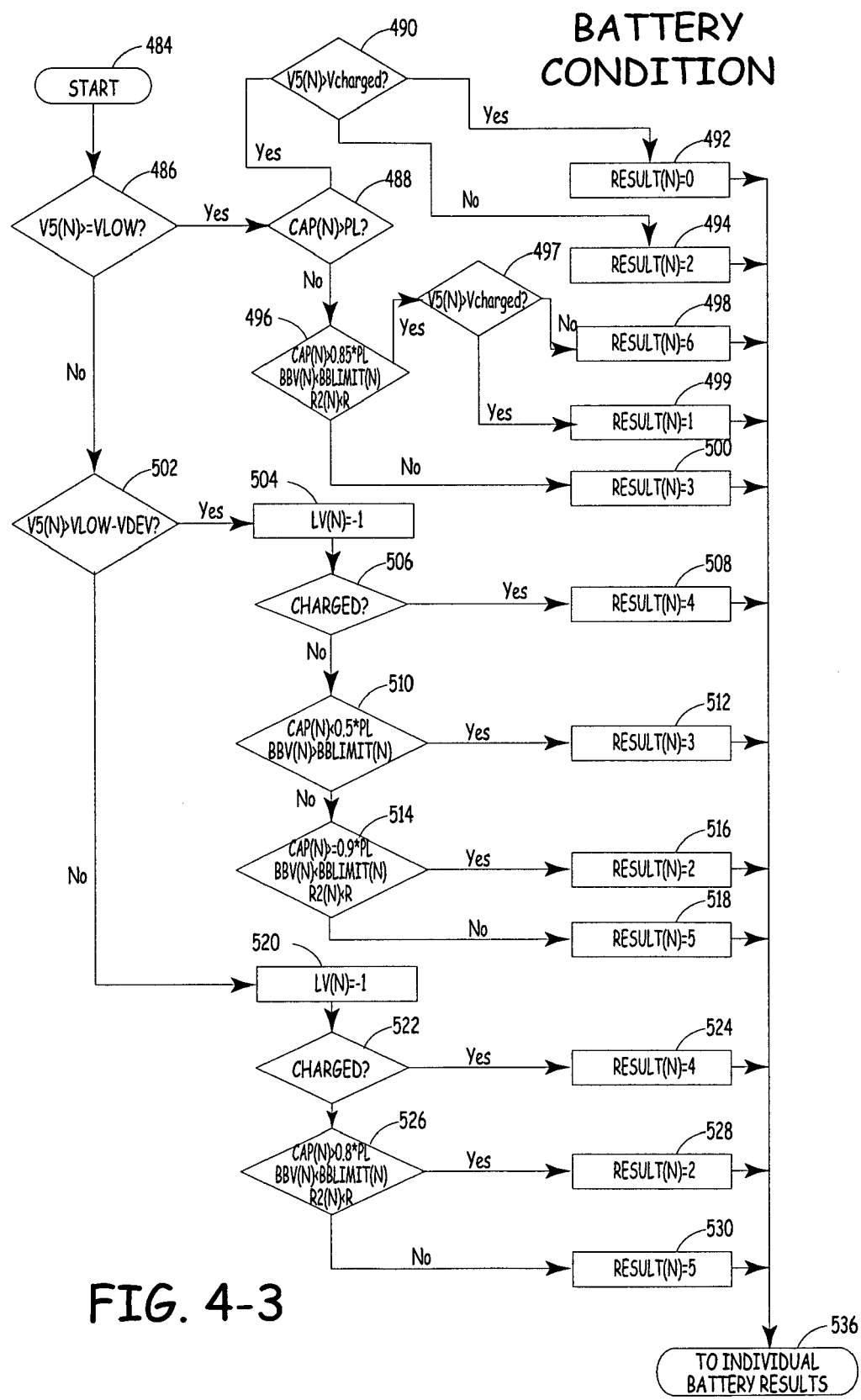
Figure 4:
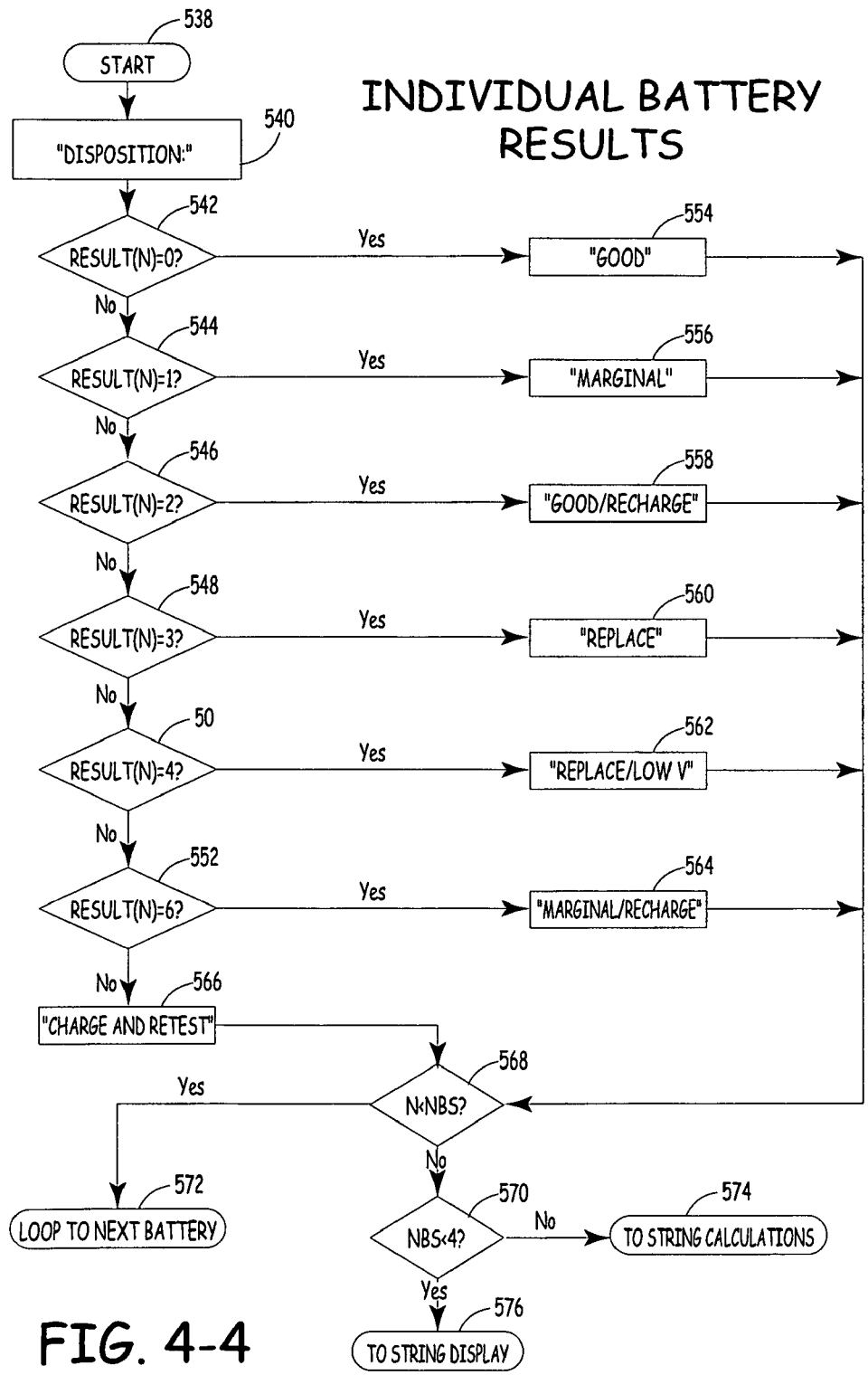

FIGS. 4-1 to 4-8 are flowcharts illustrating the implementation of a specific embodiment of the present invention. The flowchart of FIG. 4-1 shows a battery tester initialization and startup procedure, which begins at step 400. At step 402, different program variables, which are utilized for intermediate storage of data during program execution, are initialized. At step 404, a message indicative of the battery tester type is displayed from the battery display (such as output device 72 of FIGS. 1 and 2). For example, a message "GC TESTER" indicating that the tester is a golf car (GC) battery tester may be displayed. At step 406, the particular type of battery (Btype) is input by the tester user. At step 408, battery information is obtained by carrying out a procedure to get battery information, which is described further below in connection with FIG. 4-7. After completion of a procedure to get battery information, control passes to step 410. At step 410, a passing level (PL) for capacity of the battery is input by the tester user. Then, at step 412, the tester user inputs a number of batteries in the battery string (NBS). At step 414, a battery string counter (N) is initialized. After completion of step 414, control passes to step 417. Also, control passes to step 417, via step 416, from an individual battery test results procedure, which is described further below in connection with FIG. 4-4, that determines that there are more batteries in the string that need to be tested (i.e., the condition N<NBS is satisfied). At step 417, N is incremented by one. At step 418, a determination is made as to whether NBS is less than 4. If it is, indicating a string that has limited ability to make comparisons of individual batteries, then in step 419 a string charge flag is set to charged (CHARGE=−1) a charge question flag is set to false (CQ=0) and control is passed to step 420. If the condition of step 418 is not met, control also passes to step 420. At step 420, a determination is made as to whether NBS is greater than 1, whether N is less than NBS and whether N is greater than 1. If this condition is satisfied, a "CONNECT NEXT BATTERY" prompt is displayed to the tester user, at step 422, via the battery display (such as output device 72 of FIGS. 1 and 2). The tester must retain information in its memory because power that may be derived from the test battery will be interrupted when moving the connections to the next battery. If the condition at step 420 is not satisfied, battery information is obtained, at step 424, by carrying out the procedure to get battery information (FIG. 4-7). Also, after the next battery is connected (step 422), battery information is obtained, at step 424, by carrying out the procedure to get battery information (FIG. 4-7). At step 426, an OCV and a conductance (G) of the presently tested battery N of the string are measured. At step 428, parameter limits for the battery type (Btype) are checked. At step 430, a capacity of the presently tested battery (CAP(N)) is determined as a function of the measured battery conductance (G) and the battery type (Btype). At step 432, a determination is made as to whether or not the entered or input battery type (Btype) is a wrong battery type based on results obtained in steps 428 and 430. If the battery type is wrong, at step 434, a message "WRONG BATTERY TYPE" is displayed and control returns to step 402. If the battery type is correct, control proceeds to step 436 at which a depolarizing load is applied to the battery for 2 seconds, for example, and the battery is allowed to stabilize for a period of time (5 seconds, for example). At step 438, the OCV of the presently tested battery (hereinafter represented as V5(N)) is measured. A step 440, a load test indicator variable or flag (LOADTEST) is set to indicate that a load test has not yet been conducted (LOADTEST=0, for example). At step 442, a determination is made as to whether V5(N) is less than a low voltage limit (VLOW), which is a minimum OCV for reasonable battery measurements. If V5(N) is less than VLOW, control is passed, via step 448, to a load test procedure, which is described further below in connection with FIG. 3-8. If the V5(N) is greater than or equal to VLOW, control passes to step 444 at which a determination is made as to whether the computed capacity of the presently tested battery (CAP(N)) is less than the passing level of battery capacity (PL). If CAP(N) is less than PL, control is passed, via step 448, to the load test procedure (FIG. 3-8). If, at step 444, CAP(N) is greater than or equal to PL, control passes to step 446 at which a determination is made as to whether CAP(N) is greater than a maximum battery capacity (CAPMAX). If CAP (N) is greater than CAPMAX, control is passed, via step 448, to the load test procedure (FIG. 3-8). If CAP(N) is less than or equal to CAPMAX, control passes to step 450. Also, after the load test procedure is carried out, via step 446, control passes to step 450. At step 450, control is passed to a calculations procedure, which is described below in connection with FIG. 4-2.

FIG. 4-2 shows a flowchart of the calculations procedure, which begins at step 452. At step 454, a determination is made as to whether the load test indicator flag has been set indicating that a load has been impressed on the battery (i.e., whether LOADTEST=-1, for example). If the load test indicator flag is not set, then control passes, via step 482, to a battery condition procedure, which is described further below in connection with FIG. 4-3. If the load test indicator flag is set, the following computations are carried out at step 456:

$$R2(N)=(VBB1-V10)/I10 \quad \text{Equation 2}$$

$$BBV(N)=VBB2-VBB1 \quad \text{Equation 3}$$

$$DF=FN(V5(N), BTYPE) \quad \text{Equation 4}$$

$$BBLIMIT(N)=BBLIMIT*DF \quad \text{Equation 5}$$

where, V10 is a load voltage at 10 seconds, I10 is a load current at 10 seconds, VBB1 is an unloaded voltage at 10.5 seconds, R2(N) is the load resistance of the presently tested battery, VBB2 is an unloaded voltage at the end of 20 seconds, BBV(N) is a recovery voltage differential of the presently tested battery, DF is the discharge factor which is a mathematical function (FN) of voltage and battery type, and BBLIMIT(N) is a recovery voltage differential limit. At step 458, a determination is made as to whether CAP(N) is greater than the maximum battery capacity (CAPMAX). If this condition is satisfied, at step 460, a determination is made as to whether BBV(N) is greater than a fraction of BBLIMIT(N) [BBV(N)>0.8*BBLIMIT(N), for example] and whether BBV(N) is less than or equal to BBLIMIT(N). If this condition is satisfied, at step 462, CAP(N) is updated to a fraction of its original value [CAP(N)=0.85*CAP(N), for example, to accommodate new batteries that have not cycled up to normal capacity] and control passes to step 468. If the condition at step 460 is not satisfied, control passes to step 466 where CAP(N) is set equal to CAPMAX and control passes to step 468. Referring back to step 458, if the condition at this step is not satisfied, control also passes to step 468. At step 468, a determination is made as to whether V5(N) is less than VLOW and whether the battery charge has been questioned (CQ=0?). If the condition at step 468 is not satisfied, then control passes, via step 482, to the battery condition procedure (FIG. 4-3). If the condition at step 468 is satisfied, at step 470, a determination is made as to whether NBS is greater than a predetermined value (NBS>3, for example). If this condition is satisfied, control passes to step 472 at which a question "STRING CHARGED (Y/N)?" is displayed. If the condition at step 470 is not satisfied, control passes to step 474 at which a question "BATTERY CHARGED (Y/N)?" is displayed. After a Y/N is input at either step 472 or step 474, control is passed to step 476 at which a determination is made as to whether the input is equal to Y. If this condition is satisfied, at step 478, the charge indicator flag is set to a predetermined value to indicate that the battery/string is charged (CHARGED=-1, for example) and that the operator has answered the charge question (CQ=-1). If the condition at step 476 is not satisfied, at step 480, the charge indicator flag is set to a predetermined value to indicate that the battery/string is not charged (CHARGED=0, for example) but that the operator has answered the charge question (CQ=-1). After completion of either step 478 or step 480, control passes, via step 482, to the battery condition procedure, which is described below in connection with FIG. 4-3.

FIG. 4-3 shows a flowchart of the battery condition procedure, which begins at step 484. At step 486, a determination is made as to whether V5(N) is greater than or equal to VLOW. If this condition is satisfied, control passes to step 488 at which a determination is made as to whether the capacity of the battery (CAP(N)) is greater than the input passing level of capacity (PL). If this condition is satisfied, control passes to step 490 at which a determination is made if V5(N) is greater than Vcharged. If this condition is satisfied, at step 492, a result code field for the currently tested battery (RESULT(N)) is populated with a predetermined result code which is indicative of its condition (for example, RESULT(N)=0). If the condition at step 490 is not satisfied, a result code field for the currently tested battery (RESULT(N)) is populated with a predetermined result code (for example, RESULT(N)=2). If the condition at step 488 is not satisfied, control passes to step 496 at which a determination is made as to whether CAP(N) is greater than or equal to a fraction of PL (CAP(N) >=0.85*PL, for example), whether BBV(N) is less than BBLIMIT(N) and whether R2(N) is less than R. If this condition is satisfied, control passes to step 497 at which a determination is made if V5(N) is greater than Vcharged. If the condition at step 497 is satisfied, at step 499 RESULT(N) is populated with a predetermined result code (for example, RESULT(N)=1). If the condition at step 497 is not satisfied, at step 498 RESULT(N) is populated with a predetermined result code (for example, RESULT(N)=6). Referring back to step 486, if the condition at this step is not satisfied, control passes to step 502 at which a determination is made as to whether the V5(N) is less than VLOW minus a voltage deviation value (VDEV). If this condition is satisfied, at step 504, a low voltage indicator field for the current battery (LV(N)) is set to a predetermined value to indicate that the battery OCV is low (LV=-1, for example). At step 506, a determination is made as to whether on not the battery is charged by examining the contents of the flag CHARGED. If the battery is charged, at step 508, RESULT(N) is populated with a predetermined result code (for example, RESULT(N)=4). If, at step 506, it is determined that the battery is not charged, control passes to step 510. At step 510, a determination is made as to whether CAP(N) is less than a fraction of PL (CAP(N)<0.5*PL, for example) and whether BBV(N) is greater than BBLIMIT(N). If this condition is satisfied, at step 512, RESULT(N) is populated with a predetermined result code (for example, RESULT(N)=3). If the condition at step 510 is not satisfied, control passes to step 514 at which a determination is made as to whether CAP(N) is greater than or equal to a fraction of PL (CAP(N)>=0.9*PL, for example), whether BBV(N) is less than BBLIMIT(N) and whether R2(N) is less than R. If this condition is satisfied, at step 516, RESULT(N) is populated with a predetermined result code (for example, RESULT(N) =2). If the condition at step 514 is not satisfied, at step 518, RESULT(N) is populated with a different predetermined result code (for example, RESULT(N)=5). Referring back to step 502, if the condition at this step is not satisfied, control passes to step 520 at which LV(N) is set to a predetermined value to indicate that the battery OCV is low (LV=-1, for example). At step 522, a determination is made as to whether on not the battery is charged by examining the contents of the flag CHARGED. If the battery is charged, at step 524, RESULT(N) is populated with a predetermined result code (for example, RESULT(N)=4). If, at step 522, it is determined that the battery is not charged, control passes to step 526. At step 526, a determination is made as to whether CAP(N) is greater than a fraction of PL (CAP(N)>0.8*PL, for example), whether BBV(N) is less than BBLIMIT(N) and whether R2(N) is less than R. If this condition is satisfied, at step 528, RESULT(N) is populated with a predetermined result code (for example, RESULT(N)=2). If the condition at step 526 is not satisfied, at step 530, RESULT(N) is populated with a different predetermined result code (for example, RESULT (N)=5). After completion of any one of steps 492, 494, 498, 499, 500, 508, 512, 516, 518, 524, 528 and 530, control is passed via step 536, to an individual battery results procedure, which is described below in connection with FIG. 4-4.

FIG. 4-4 shows a flowchart of the individual battery results procedure, which begins at step 538. At step 540, a message "DISPOSITION:" is displayed to the user. As can be seen in FIG. 4-4, in each of steps 542 through 552, a comparison is made between the contents of RESULT(N) and a particular result code. At steps 554 through 564, results from the comparisons carried out in steps 542 through 552 are displayed. If none of the conditions in steps 542 through 552 are met, a message "CHARGE AND RETEST" is displayed at step 566. After completion of any one of steps 554 through 566, control passes to step 568. At step 568, a determination is made as to whether N is less than NBS. If this condition is satisfied, control passes, via step 572 to step 416 (FIG. 4-1). If the condition at step 568 is not satisfied, control passes to step 570 at which a determination is made as to whether NBS is less than a predetermined number (NBS<4, for example). If this condition is satisfied, the tester goes to the string display procedure where the individual results are stored and displayed without string comparison (step 576) until the tester is reset in step 682. If the condition at step 570 is not satisfied, control passes, via step 574, to a string calculations procedure, which is described below in connection with FIG. 4-5.

Figures 4, 5:
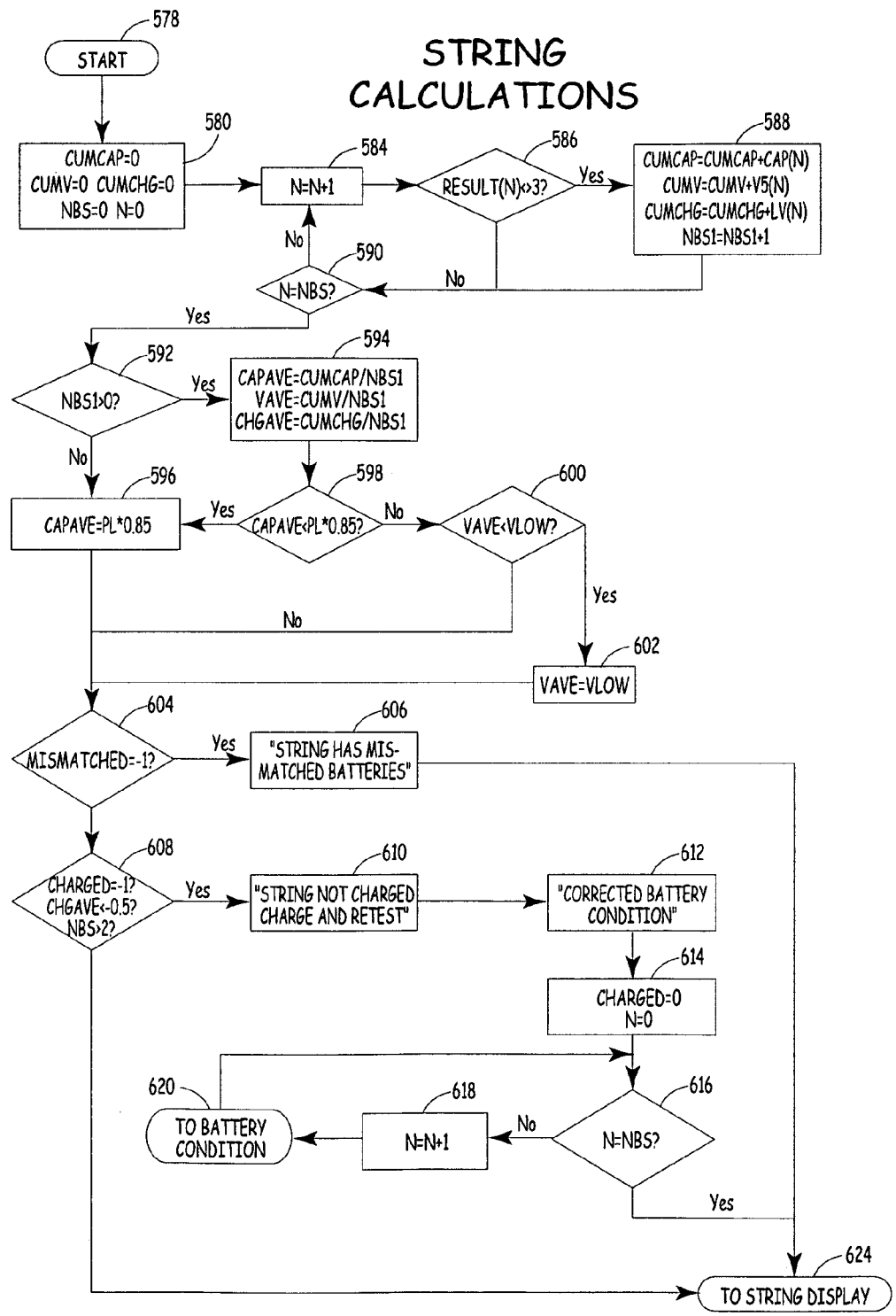

FIG. 4-5 shows a string calculations procedure, which begins at step 578. At step 580, fields that store cumulative battery capacity (CUMCAP), cumulative battery voltage (CUMV) and cumulative battery charge (CUMCHG) are initialized (CUMCAP=0, CUMV=0 AND CUMCHG=0, for example) and a field that indicates the number of good batteries in the string (NBS1) and string counter N are initialized (NBS1=0, N=0, for example). At step 584, string counter N is incremented by 1. At step 586, a determination is made as to whether the present battery N of the string is not a replaceable low capacity battery (RESULT(N)< >3, for example). If the present battery is not a low capacity battery, control passes to step 588 at which the cumulative capacity (CUMCAP) is incremented by the present battery capacity (CAP(N)), the cumulative voltage (CUMV) is incremented by present battery voltage (V5(N)), the cumulative charge is incremented by the low voltage value of the present battery (LV(N)) and NBS1 is incremented by 1. If the present battery is found to be a low capacity battery, or after step 588 is completed, control passes to step 590. At step 590, a determination is made as to whether the present battery is the last battery in the string. Steps 584, 586, 588 and 590 are repeated until this condition is satisfied. If the condition at step 590 is satisfied, control passes to step 592 at which a determination is made as to whether NBS1 is greater than 0. If this condition is satisfied, at step 594 an average capacity of the good batteries in the string (CAPAVE) is determined, using the relationship CAPAVE=CUMCAP/NBS1. Also, an average voltage of the good batteries in the string (VAVE) is determined, using the relationship VAVE=CUMV/NBS1. Furthermore, an average charge state of the good batteries in the string (CHGAVE) is determined, using the relationship CHGAVE=CUMCHG/NBS1. If the condition at step 592 is not satisfied, at step 596, the average capacity is determined as a fraction of PL (CAPAVE=PL*0.85). After the completion of step 594 or step 596, control passes to step 598. At step 598 a determination is made as to whether the average capacity of the string (CAPAVE) is less than a certain level (0.85*PL, for example). If this condition is true, then at step 596, the average capacity is determined as a fraction of PL (CAPAVE=PL*0.85) and control is transferred to step 604. If the condition in 598 is not satisfied, control is transferred to step 600, at which a determination is made as to whether the average voltage (VAVE) is less than a low voltage level (VLOW). If it is, the average voltage (VAVE) is set to a low voltage value (VLOW) in step 602 and control is transferred to step 604. If the condition in step 600 is not satisfied, control is also transferred to step 604. At step 604, a determination is made as to whether or not the string includes mismatched batteries. If mismatched batteries are indicated, control passes to step 606 at which a message is displayed that the string contains mismatched batteries and control passes directly to the string display section (FIG. 4-6) via step 624. If there are no mismatched batteries in the string, control passes to step 608 at which a determination is made as to whether the operator has indicated that the batteries are charged (CHARGED=-1?) but the average charge is low (CHGAVE <-0.5) and the number of batteries in the string is greater than a given value (NBS>2, for example). If the conditions of step 608 are not met, control is transferred directly to the string display procedure via step 624 which is described below in connection with FIG. 4-6. If these conditions are satisfied, then a message is displayed in step 610 that the string is not charged and that the batteries need to be charged and retested. Control is then transferred to step 612 at which a message is displayed showing that the condition of the batteries is being reassessed ("CORRECTED BATTERY CONDITION"). At the next step 614 the charge flag is reset (CHARGED=0) and a counter is reset (N=0). The counter is then tested to see if it is equal to the number of batteries in the string (N=NBS?) in step 616. If not, the counter is incremented by one in step 618 and control is transferred to the battery condition procedure via step 620 after which control again returns to step 616. If the condition of step 616 is satisfied, control is transferred to the string display procedure via step 624 which is described below in connection with FIG. 4-6.

Figures 4, 5, 6:
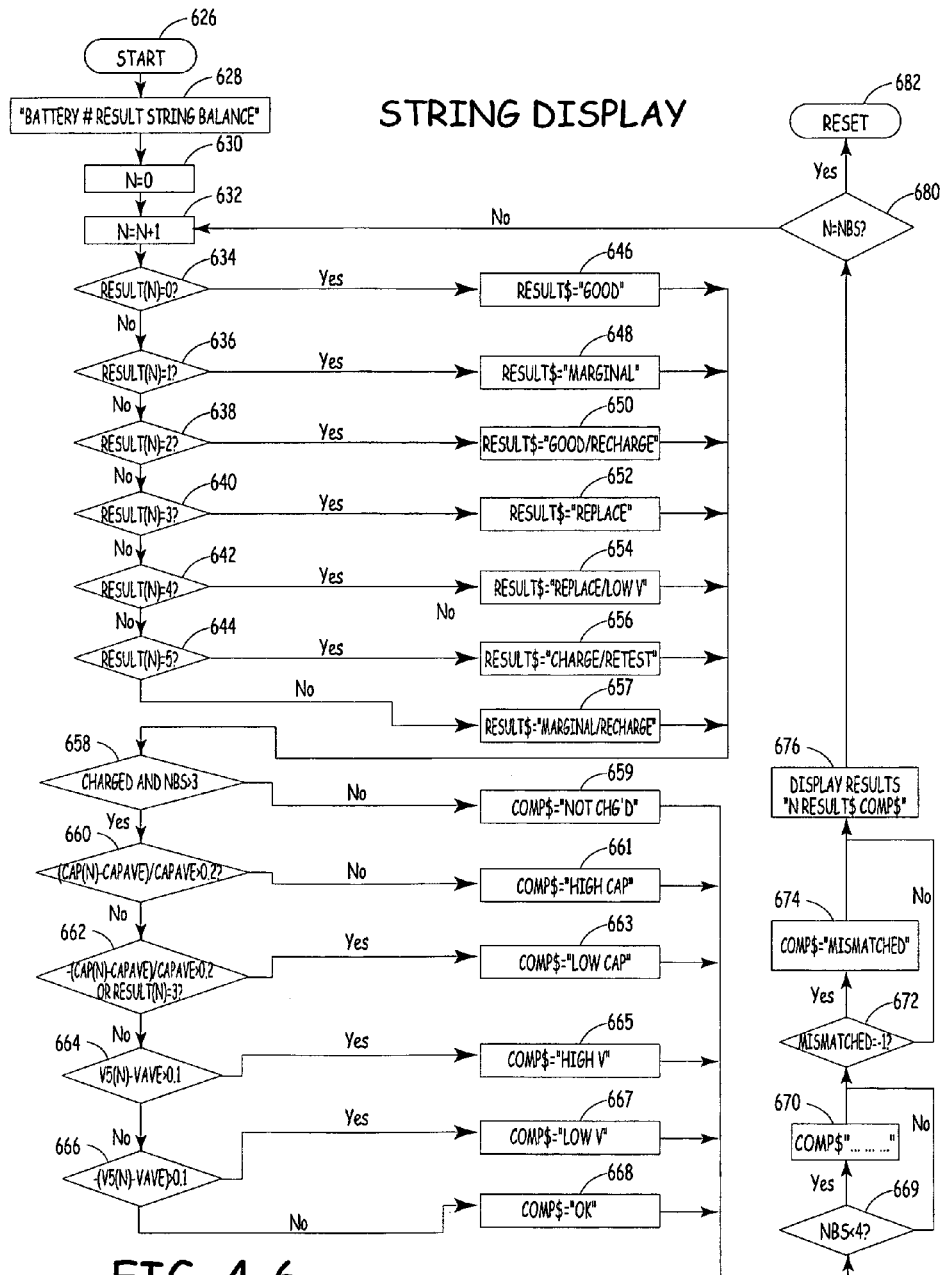
Figures 4, 5, 6, 7:
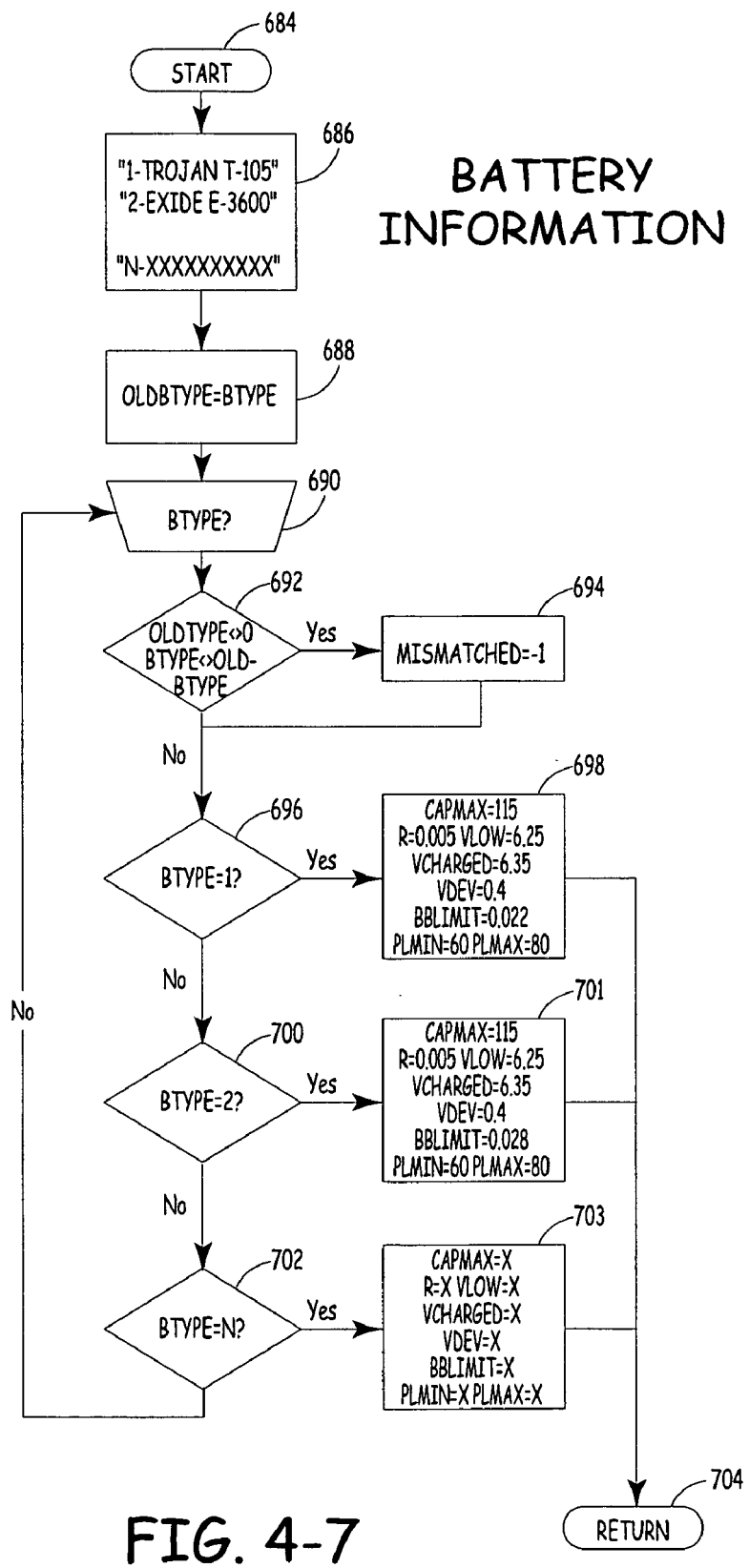
Figures 4, 5, 6, 7, 8:
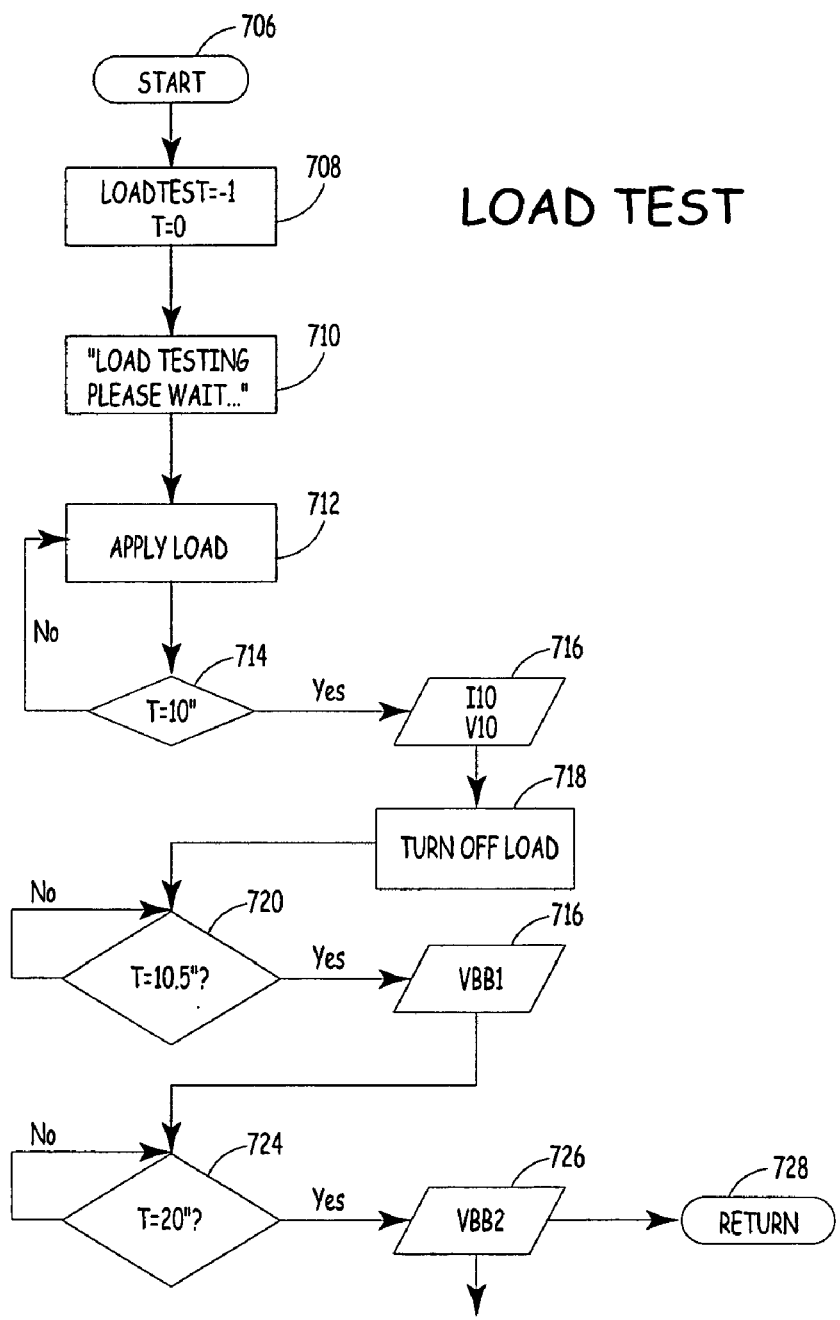

FIG. 4-6 shows the string display procedure, which begins at step 626. At step 628, a message "BATTERY# RESULT STRING BALANCE" is displayed to the user. At step 630, battery string counter N is initialized. At step 632, N is incremented by 1. As can be seen in FIG. 4-6, in each of steps 634 through 644, a comparison is made between the contents of RESULT(N) and a particular result code. At steps 646 through 657, results from the comparisons carried out in steps 634 through 644 are stored in result output fields. After completion of any one of steps 646 through 657, control passes to step 658 at which a determination is made as to whether the string (NBS>3) is charged. If it is not, the string comparison is displayed that the string is not charged ("NOT CHG'D") at step 659. At steps 660 and 662, computations and comparisons are carried out to determine whether the present battery of the string has a high or low capacity. At steps 661 and 663, results from the comparisons carried out in steps 660 and 662 are stored in string balance output fields. If the condition at step 662 is not satisfied, control passes to step 664. At steps 664 and 666, computations and comparisons are carried out to determine the voltage level of the present battery in the string. At steps 665 through 667, results from the comparisons carried out in steps 664 and 666 are stored in string balance output fields. If none of the exception conditions in steps 658 through 666 are met, the string balance field is filled with a condition that indicates that the battery is satisfactory for the string ("OK"). After completion of any one of steps 659, 661, 663, 665, 667 and 668, control passes to step 669 at which it is determined if the number of batteries in the string is less than a given number (NBS<4, for example). If there are few batteries in the string, the comparison field gets reset to display no information (" . . . ") at step 670 and control is transferred to step 672. If the condition in step 669 determines that there are sufficient batteries in a string, control is transferred to step 672. At step 672, a determination is made as to whether there are mismatched batteries in the string (MISMATCHED=−1?). If that condition is true, the string comparison field is filled with a message indicating the batteries are mismatched. If the condition in step 672 indicates there are no mismatched batteries, then the fields for each battery (number, result and string comparison) are displayed in step 676. After step 676, control is transferred to step 680 at which a determination is made as to whether the routine has encountered the final battery (N=NBS). If it has not, control returns to step 632 to increment to the next battery. If it is the last battery, control is transferred to a reset procedure in step 682.

FIG. 4-7 shows a flowchart of the battery information procedure, which begins at step 684. At step 686, codes corresponding to different battery types are displayed. For example, code 1 corresponds to a TROJAN T-105 battery (1--TROJAN T-105) and code 2 corresponds to an EXIDE E-3600 battery (2--EXIDE E-3600) continuing to battery N (N-XXXXXXX). At step 688, the contents of BTYPE are copied to an old battery type field (OLDBTYPE). At step 690, the contents of BTYPE are examined. At step 692, a determination is made as to whether OLDBTYPE is not equal to a predetermined value (OLDBTYPE not equal to 0, for example) and whether BTYPE is not equal to OLDBTYPE. If this condition is satisfied, control passes to step 694 at which a battery type mismatch field or flag (MISMATCHED) is set to a predetermined value to indicate that the battery type is mismatched (MISMATCHED=−1, for example). If the condition in step 692 is not satisfied, or after the completion of step 694, control passes to step 696. At step 696, a determination is made as to whether BTYPE is equal to a predetermined battery code (for example, whether BTYPE is equal to battery code 1). If this condition is satisfied, at step 698, a number of fields are set to predetermined values. For example, CAPMAX=115, R=0.005, VLOW=6.25, Vcharged=6.35, VDEV=0.4, BBLIMIT=0.022, PLMIN=60 and PLMAX=80. PLMIN and PLMAX are the respective allowable minimum and maximum passing levels of capacity. If the condition at step 696 is not satisfied, control passes to steps 700 through 702 at which a determination is made as to whether BTYPE is equal to another predetermined battery code (for example, whether BTYPE is equal to battery code 2). If this condition is satisfied, the variable fields are set to predetermined values unique to that battery type as shown, for example, in battery code 1. If no battery type input by the user can be found, control returns to step 690 for another battery type code. Control from any of steps 698, 701 and 703 is passed to the flowchart of FIG. 4-1 via step 704.

FIG. 4-8 shows a flowchart of the battery load test procedure, which begins at step 706. At step 708, the load test flag (LOADTEST) is set and the timer is initialized (T=0). At step 710, a message "LOAD TESTING PLEASE WAIT . . . " is displayed. At steps 712 and 714, a load is applied on the battery for a period of time (10 seconds, for example). At step 716, the battery voltage and current is measured at the end of the time period. The load is turned off at step 718. At step 722, an unloaded voltage VBB1 is measured after a short delay (0.5 seconds or T=10.5 seconds, for example) at step 720. At step 726, a second unloaded voltage VBB2 is measured after an additional wait period in step 724 (10 seconds or T=20, for example). After completion of step 726, control then returns, via step 728, to the initialization and startup procedure (FIG. 4-1).

Instructions for carrying out the above procedure (FIGS. 4-1 to 4-8) are stored in a memory 60, which is coupled to microprocessor 56 that executes these instructions. Different techniques, some of which are set forth above, can be employed to carry out the steps shown in the above flowcharts while maintaining substantially the same functionality without departing from the scope and spirit of the present invention.

Although the present invention has been described with reference to preferred embodiments, workers skilled in the art will recognize that changes may be made in form and detail without departing from the spirit and scope of the invention. Also, if battery temperature experiences large variations from normal room ambient conditions, a correction factor can be applied to the results using manual or automatic battery temperature input. For example, although the above embodiments have been described in connection with golf car batteries, the battery testing techniques of the present invention can be utilized for testing a number of different types of batteries, without departing from the scope and spirit of the present invention.

What is claimed is:

1. A method of testing a storage battery, comprising:
   (a) measuring a dynamic parameter of the battery;
   (b) obtaining an open circuit voltage of the battery;
   (c) measuring a recovery voltage differential of the battery; and
   (d) determining a condition of the battery as a function of the measured battery dynamic parameter, the open circuit voltage, the measured recovery voltage differential and a recovery voltage differential limit, which is a boundary condition for the recovery voltage differential.

2. The method of claim 1 wherein the determining step (d) comprises predicting a capacity of the battery as a function of the measured battery dynamic parameter, the open circuit voltage and the measured recovery voltage differential and comparing the predicted capacity with a passing level of capacity.

3. The method of claim 2 further comprising providing an output indicative of the condition of the battery based on the comparison of the predicted capacity with the passing level of capacity.

4. The method of claim 1 wherein the dynamic parameter measurement step (a) comprises determining a response of the battery to at least one applied current pulse.

5. The method of claim 1 wherein the measured battery dynamic parameter is battery conductance.

6. The method of claim 1 wherein the storage battery is one of a plurality of storage batteries that form a battery string and wherein steps (a) though (d) are carried out for each battery of the plurality of storage batteries.

7. The method of claim 6 further comprising utilizing results obtained by carrying out steps (a) through (d) for individual batteries of the battery string to obtain battery string results.

8. The method of claim 7 wherein the battery string results comprise a string number result, determined as a function of a total number of batteries in the string and a threshold number of batteries, that indicates whether or not the number of batteries in the string is too small to make meaningful string comparisons.

9. The method of claim 7 wherein the battery string results comprise a string capacity balance result for each battery of the plurality of batteries, and wherein the string capacity balance result is determined as a function of a respective capacity of an individual battery of the plurality of batteries and an average string capacity for the plurality of batteries.

10. The method of claim 7 wherein the battery string results comprise a string voltage balance result for each battery of the plurality of batteries, and wherein the string voltage balance result is determined as a function of a respective open circuit voltage of an individual battery of the plurality of batteries and an average voltage for the string.

11. An electronic battery tester comprising:
  a positive connector configured to couple to a positive terminal of the battery;
  a negative connector configured to couple to a negative terminal of the battery;
  a voltage sensor configured to measure an open circuit voltage and a recovery voltage differential of the battery; and
  battery test circuitry configured to
    (a) measure a dynamic parameter of the battery using the first and second connectors; and
    (b) determine a condition of the battery as a function of the measured battery dynamic parameter, the open circuit voltage, the measured recovery voltage differential and a recovery voltage differential limit, which is a boundary condition for the recovery voltage differential.

12. The apparatus of claim 11 wherein the battery test circuitry is configured to determine the condition of the battery step (b) by predicting a capacity of the battery as a function of the measured battery dynamic parameter, the open circuit voltage and the measured recovery voltage differential and comparing the predicted capacity with a passing level of capacity.

13. The apparatus of claim 12 wherein the battery test circuitry is further configured to provide an output indicative of the condition of the battery based on the comparison of the predicted capacity with the passing level of capacity.

14. The apparatus of claim 11 wherein the battery test circuitry is configured to measure the dynamic parameter step (a) by determining a response of the battery to an applied current pulse.

15. The apparatus of claim 11 wherein the storage battery is one of a plurality of storage batteries that form a battery string and wherein the battery test circuitry is configured to carry out steps (a) and (b) for each battery of the plurality of storage batteries.

16. The apparatus of claim 15 wherein the battery test circuitry is further configured to carry out steps (a) and (b) for individual batteries of the battery string to obtain battery string results.

17. The apparatus of claim 16 wherein the battery string results comprise a string number result, determined by the battery test circuitry as a function of a total number of batteries in the string and a threshold number of batteries, that indicates whether or not the number of batteries in the string is too small to make meaningful string comparisons.

18. The apparatus of claim 16 wherein the battery string results comprise a string capacity balance result for each battery of the plurality of batteries, and wherein the string capacity balance result is determined by the battery test circuitry as a function of a respective capacity of an individual battery of the plurality of batteries and an average string capacity for the plurality of batteries.

19. The apparatus of claim 16 wherein the battery string results comprise a string voltage balance result for each battery of the plurality of batteries, and wherein the string voltage balance result is determined by the battery test circuitry as a function of a respective open circuit voltage of an individual battery of the plurality of batteries and an average voltage for the string.

20. A method of testing a storage battery, comprising:
  (a) measuring a dynamic parameter of the battery;
  (b) obtaining an open circuit voltage of the battery;
  (c) measuring a recovery voltage differential of the battery; and
  (d) measuring a capacity of the battery as a function of the measured battery dynamic parameter, the open circuit voltage, the recovery voltage differential, a resistance limit of the battery, and a recovery voltage differential limit, which is a boundary condition for the recovery voltage differential.

* * * * *